(12) United States Patent
Simin et al.

(10) Patent No.: US 9,647,076 B2
(45) Date of Patent: May 9, 2017

(54) CIRCUIT INCLUDING SEMICONDUCTOR DEVICE WITH MULTIPLE INDIVIDUALLY BIASED SPACE-CHARGE CONTROL ELECTRODES

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/096,930

(22) Filed: Apr. 12, 2016

(65) Prior Publication Data
US 2016/0225863 A1    Aug. 4, 2016

Related U.S. Application Data

(63) Continuation-in-part of application No. 14/576,310, filed on Dec. 19, 2014, now Pat. No. 9,312,347, (Continued)

(51) Int. Cl.
*H01L 29/02*      (2006.01)
*H01L 29/40*      (2006.01)
(Continued)

(52) U.S. Cl.
CPC ........ *H01L 29/404* (2013.01); *H01L 29/0619* (2013.01); *H01L 29/7786* (2013.01);
(Continued)

(58) Field of Classification Search
CPC .......... H01L 45/04; H01L 29/00; H01L 27/24
(Continued)

(56) References Cited

U.S. PATENT DOCUMENTS 5,313,083 A * 5/1994 Schindler .......... H01L 29/42316
257/280
6,096,641 A * 8/2000 Kunikiyo .......... H01L 21/28105
257/E21.196
(Continued)

FOREIGN PATENT DOCUMENTS

KR    10-2014-0115585 A    10/2014

OTHER PUBLICATIONS

Choi, S., International Application No. PCT/US2015/066650, Written Opinion and Search Report, Apr. 29, 2016, 15 pages.
(Continued)

*Primary Examiner* — Jami M Valentine
(74) *Attorney, Agent, or Firm* — LaBatt, LLC

(57) ABSTRACT

A circuit including a semiconductor device having a set of space-charge control electrodes is provided. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal.

20 Claims, 12 Drawing Sheets

Related U.S. Application Data which is a continuation-in-part of application No. 14/527,203, filed on Oct. 29, 2014, now Pat. No. 9,256,240, which is a continuation of application No. 13/682,587, filed on Nov. 20, 2012, now Pat. No. 8,878,154, said application No. 14/576,310 is a continuation-in-part of application No. 13/682,139, filed on Nov. 20, 2012, now Pat. No. 8,994,035.

(60) Provisional application No. 61/561,980, filed on Nov. 21, 2011, provisional application No. 61/561,989, filed on Nov. 21, 2011.

(51) Int. Cl.
| | |
|---|---|
| *H01L 29/778* | (2006.01) |
| *H01L 29/872* | (2006.01) |
| *H01L 29/06* | (2006.01) |
| H01L 29/20 | (2006.01) |
| H01L 29/417 | (2006.01) |

(52) U.S. Cl.
CPC ........ *H01L 29/872* (2013.01); *H01L 29/2003* (2013.01); *H01L 29/405* (2013.01); *H01L 29/41725* (2013.01)

(58) Field of Classification Search
USPC .................. 257/1–5, E29.002; 438/102–104
See application file for complete search history.

(56) References Cited

U.S. PATENT DOCUMENTS

| | | | |
|---|---|---|---|
| 8,586,997 | B2 | 11/2013 | Simin et al. |
| 8,878,154 | B2 | 11/2014 | Simin et al. |
| 9,256,240 | B2 | 2/2016 | Simin et al. |
| 2008/0073670 | A1 | 3/2008 | Yang et al. |
| 2009/0159925 | A1 | 6/2009 | Machida |
| 2009/0256176 | A1* | 10/2009 | Kobayashi ........ H01L 27/14603 257/225 |
| 2010/0156475 | A1* | 6/2010 | Simin ................ H01L 29/7786 327/109 |
| 2011/0221011 | A1 | 9/2011 | Bahat-Treidel et al. |
| 2013/0056753 | A1 | 3/2013 | Simin et al. |
| 2013/0062693 | A1 | 3/2013 | Tanaka |
| 2013/0126905 | A1 | 5/2013 | Simin et al. |
| 2014/0353723 | A1 | 12/2014 | Briere |
| 2015/0102364 | A1 | 4/2015 | Simin et al. |
| 2015/0102388 | A1 | 4/2015 | Simin et al. |

OTHER PUBLICATIONS

Feiler et al., Multistep Field Plates for High-Voltage Planar p-n Junctions, IEEE Transactions on Electron Devices, Jun. 1992, pp. 1514-1520, vol. 39 No. 6, IEEE.

Karmalkar et al., Enhancement of Breakdown Voltage in AlGaN/GaN High Electron Mobility Transistors Using a Field Plate, IEEE Transactions on Electron Devices, Aug. 2001, pp. 1515-1521, vol. 48 No. 8., IEEE.

Saito et al., Theoretical limit estimation of lateral wide band-gap semiconductor power-switching device, Solid-State Electronics, 2004, pp. 1555-1562, Elsevier.

Simin, G., U.S. Appl. No. 13/682,587, Notice of Allowance, Jul. 8, 2014, 8 pgs.

Simin, G., U.S. Appl. No. 13/682,587, Office Action 1, Feb. 28, 2014, 11 pgs.

Valentine, J., U.S. Appl. No. 14/527,203, Notice of Allowance, Sep. 29, 2015, 10 pgs.

Valentine, J., U.S. Appl. No. 14/527,203, Notice of Allowance, Aug. 14, 2015, 92 pgs.

Valentine, J., U.S. Appl. No. 14/527,203, Final Office Action 1, Jun. 4, 2015, 32 pgs.

Valentine, J., U.S. Appl. No. 14/527,203, Office Action 1, Dec. 31, 2014, 14 pgs.

Valentine, J., U.S. Appl. No. 14/576,310, Notice of Allowance, Dec. 10, 2015, 44 pgs.

Valentine, J., U.S. Appl. No. 14/576,310, Final Office Action 1, Sep. 29, 2015, 11 pgs.

Valentine, J., U.S. Appl. No. 14/576,310, Office Action 1, Apr. 27, 2015, 13 pgs.

* cited by examiner

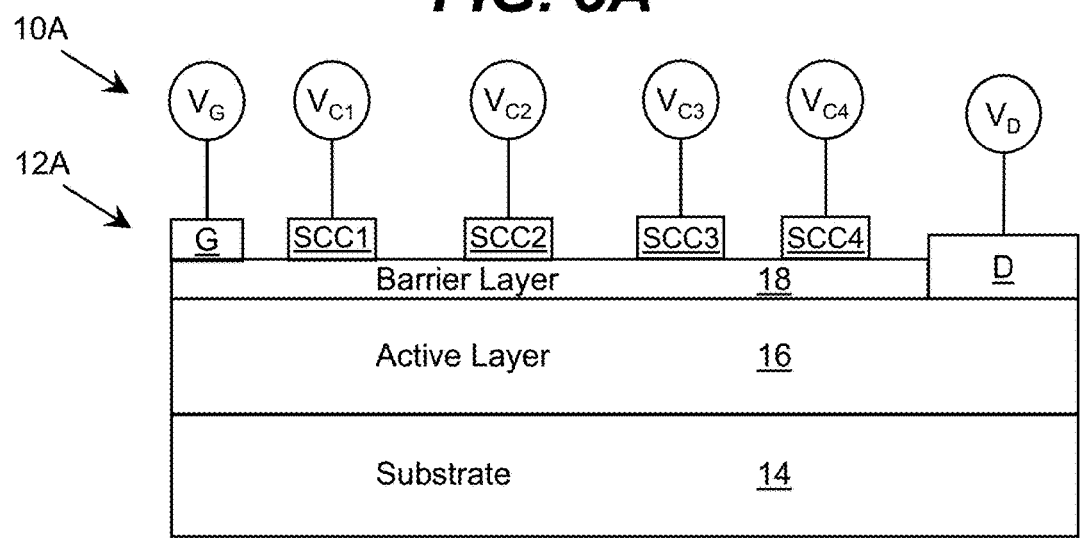
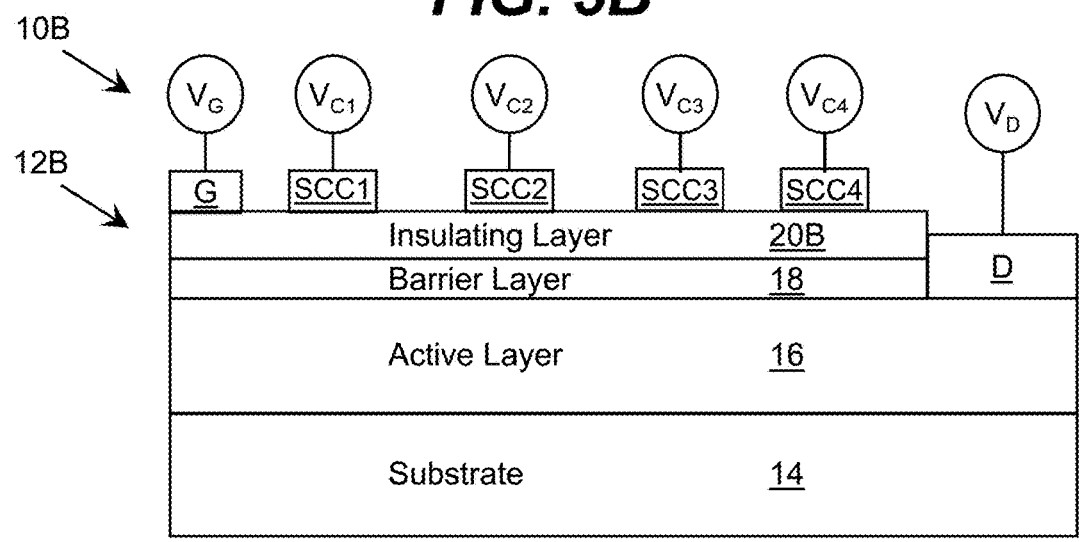

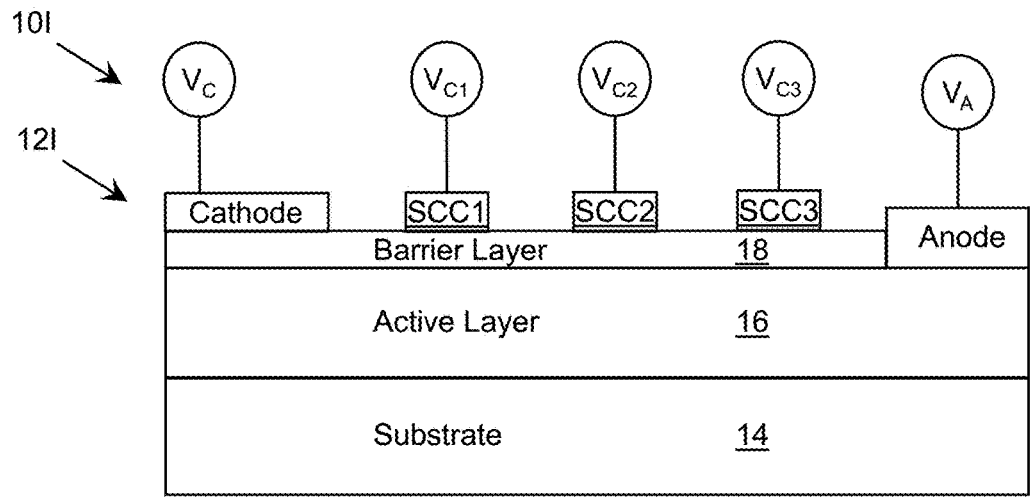
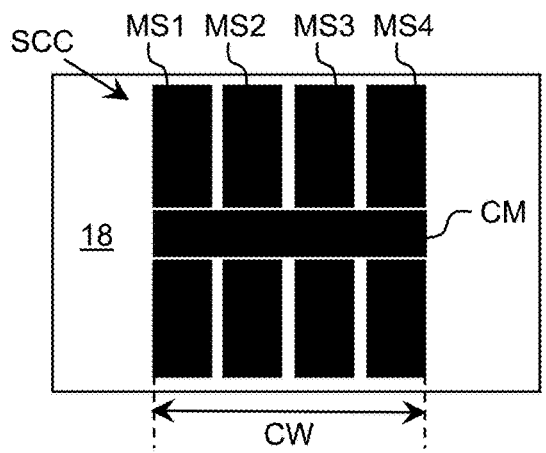
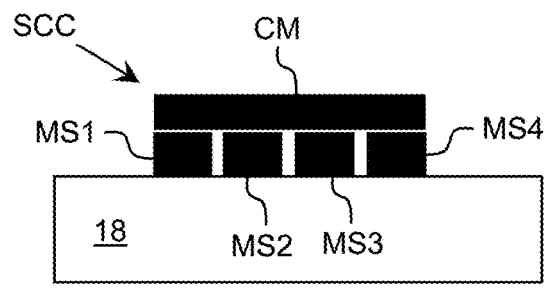

CIRCUIT INCLUDING SEMICONDUCTOR DEVICE WITH MULTIPLE INDIVIDUALLY BIASED SPACE-CHARGE CONTROL ELECTRODES

REFERENCE TO RELATED APPLICATIONS

The current application is a continuation-in-part of U.S. Utility application Ser. No. 14/576,310, filed on 19 Dec. 2014, which is a continuation-in-part of: (a) U.S. Utility application Ser. No. 14/527,203, filed on 29 Oct. 2014, which is a continuation of U.S. Utility application Ser. No. 13/682,587 filed on 20 Nov. 2012, now U.S. Pat. No. 8,878,154, which claims the benefit of U.S. Provisional Application No. 61/561,980, which was filed on 21 Nov. 2011; and (b) U.S. Utility application Ser. No. 13/682,139, filed on 20 Nov. 2012, which claims the benefit of U.S. Provisional Application No. 61/561,989, filed on 21 Nov. 2011. All of the above-referenced applications are hereby incorporated by reference.

TECHNICAL FIELD

The disclosure relates generally to semiconductor devices, and more particularly, to a semiconductor device with multiple space-charge control electrodes.

BACKGROUND ART

In power semiconductor devices, achieving the highest breakdown voltage simultaneously with minimal on-resistance is one of the most important performance characteristics. Lateral geometry devices, such as field-effect transistors (FETs), including metal oxide semiconductor FETs (MOSFETs), metal semiconductor FETs (MESFETs), high electron mobility transistors (HEMTs), etc., have a channel aligned along the semiconductor surface, and which is often located close to the semiconductor surface. If the space-charge (depletion) region occupies only a portion of the gate-drain spacing, the electric field in that spacing is strongly non-uniform and can result in premature breakdown, which limits the device performance. Due to a high carrier concentration in the channel and the close vicinity of the channel to the semiconductor surface, efficient control over the space charge distribution in the gate-drain spacing is extremely challenging.

FIG. 1 shows a conventional heterostructure FET (HFET) 2 according to the prior art, and FIG. 2 shows an illustrative electric field distribution chart according to the prior art. As illustrated in FIG. 2, the electric field profile in the gate-drain spacing having a distance, $L_{GD}$, shown in FIG. 1 exhibits a strong peak near the gate edge when the HFET 2 is operated as a switch (without field plate). The peak width is defined by the carrier concentration in the channel. To this extent, a breakdown voltage for the HFET 2 does not increase when the gate-drain spacing distance $L_{GD}$ is increased.

One approach to lower the peak electric field near the gate edge is the use of one or more field-modulating plates (FPs), which can be connected to either the gate, source, or drain electrode. FIG. 2 illustrates an illustrative field plate connected to a gate and the resulting electric field distribution. A multistep field plate structure is shown in FIG. 3, and a gradual field plate structure is shown in FIG. 4. In each case, the field plate structure decreases the peak field near the gate electrode edge by splitting it into two or more peaks, thereby increasing the breakdown voltage for the device. However, even multiple field plate structures cannot achieve a uniform electric field in the device channel.

Additionally, optimal configuration of multiple field plates is difficult to achieve. For example, the optimal configuration requires precisely controlled field plate length and dielectric thickness variation along the channel. In addition, prior art field plates have either source or gate potential applied to them, and therefore significant voltage exists between the field plate and the drain electrode. As a result, a device including field plate(s) can suffer from premature breakdown between the field plate(s) and the drain electrode. Furthermore, the field plate(s) increases the inter-electrode and electrode-semiconductor capacitances and therefore decreases the device maximum operating frequency.

As a result of the above limitations, current high-voltage FET switches (i) do not achieve the breakdown voltages predicted by fundamental material properties and (ii) exhibit breakdown voltage—gate-drain spacing dependence saturating at high voltages, typically four hundred volts and above, which imposes serious limitations on device design for kilovolt switching applications.

SUMMARY OF THE INVENTION

Aspects of the invention provide a circuit including a semiconductor device having a set of space-charge control electrodes. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal.

A first aspect of the invention provides a circuit comprising: a semiconductor device including: a semiconductor structure including a channel; a first terminal and a second terminal to the channel; and a set of space-charge control electrodes located between the first terminal and the second terminal on a surface of the semiconductor structure; and a biasing network supplying an individual bias voltage to each of the set of space-charge control electrodes, wherein the bias voltage for each of the set of space-charge control electrodes is selected based on a bias voltage of the first terminal, a bias voltage of the second terminal, and a location of the space-charge control electrode relative to the first terminal and the second terminal.

A second aspect of the invention provides a circuit comprising: a semiconductor device including: a semiconductor structure including a channel; a first terminal and a second terminal to the channel; and a set of space-charge control electrodes located between the first terminal and the second terminal on a surface of the semiconductor structure; and a biasing network supplying an individual bias voltage to each of the set of space-charge control electrodes, wherein the bias voltage for each of the set of space-charge control electrodes is configured to deplete a region of the channel under the corresponding space-charge control electrode at an operating voltage applied to the second terminal.

A third aspect of the invention provides a circuit comprising: a transistor including: a semiconductor structure including a channel; a gate and a drain; and a set of space-charge control electrodes located between the gate and the drain on a surface of the semiconductor structure; and a biasing network supplying an individual bias voltage to each of the set of space-charge control electrodes, wherein the bias voltage for each of the set of space-charge control electrodes is selected based on a bias voltage of the gate, a bias voltage of the drain, and a location of the space-charge control electrode relative to the gate and the drain.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 5A-5F show schematic structures of gate-drain regions of illustrative devices connected in circuits according to embodiments.

FIG. 9 shows a schematic structure of an illustrative diode connected in a circuit according to an embodiment.

FIGS. 12A and 12B show top and side views, respectively, of an illustrative space-charge control electrode according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
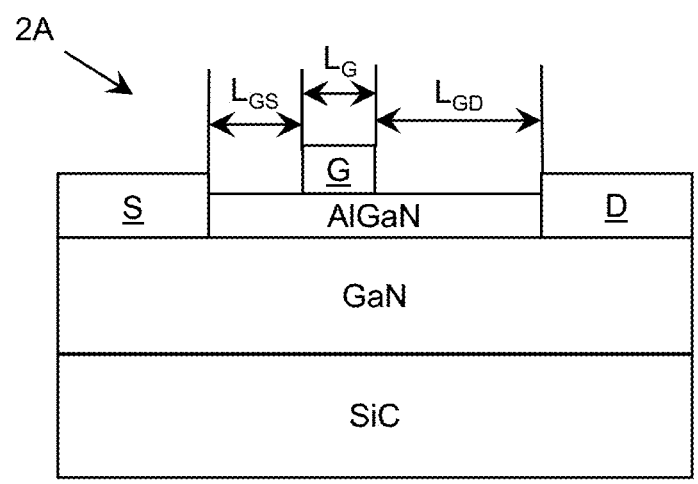
FIG. 1 shows a conventional heterostructure field effect transistor according to the prior art.
Figure 2:
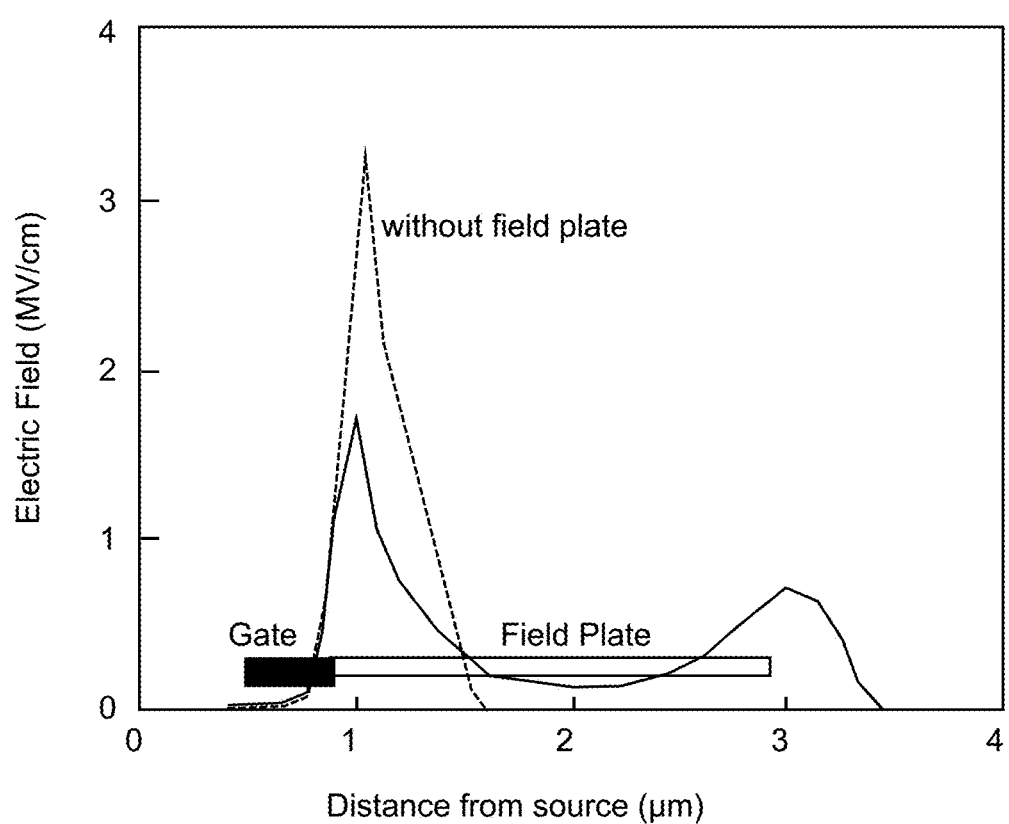
FIG. 2 shows an illustrative electric field distribution chart according to the prior art.
Figure 3:
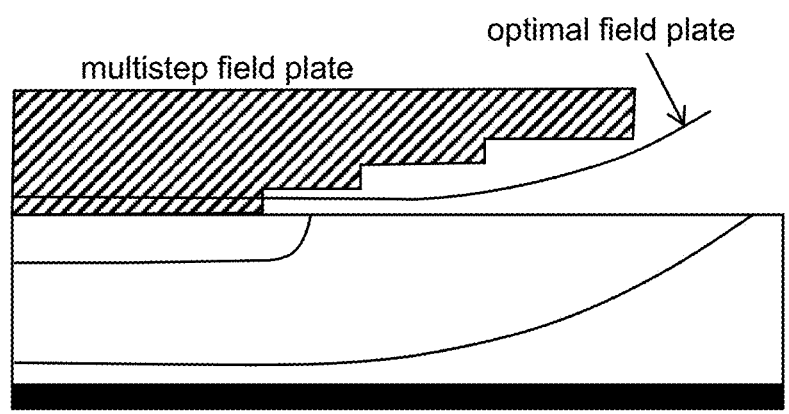
FIG. 3 shows a schematic structure of a multistep field plate according to the prior art.
Figure 4:
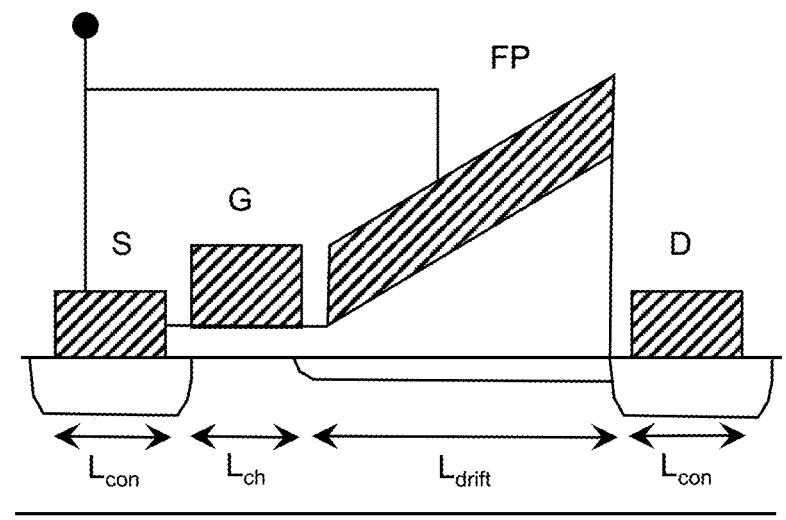
FIG. 4 shows a schematic structure of a gradual field plate according to the prior art.

As indicated above, aspects of the invention provide a circuit including a semiconductor device having a set of space-charge control electrodes. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal. Aspects of the invention can provide a solution for increasing an operating voltage and/or a maximum power of the semiconductor device within the circuit. As used herein, unless otherwise noted, the term "set" means one or more (i.e., at least one) and the phrase "any solution" means any now known or later developed solution.

Turning to the drawings, FIGS. 5A-5F show schematic structures of gate-drain regions of illustrative devices 12A-12F connected in circuits 10A-10F according to embodiments. Each device 12A-12 is shown including a substrate 14, an active layer 16, a barrier layer 18, a gate G, and a drain D. A channel is formed at a junction of the active layer 16 and the barrier layer 18. While not shown in all of the figures for clarity, it is understood that a device 12A-12F can include various additional contacts (e.g., a source contact S (FIG. 5F)) and/or layers (e.g., an initiation layer 13 (FIG. 5F) and/or a buffer layer 15 (FIGS. 5E, 5F) located between the substrate 14 and the active layer 16). Each device 12A-12F, and components thereof, can be manufactured and fabricated using any solution. In an embodiment, the substrate 14 is formed of silicon carbide (SiC), the active layer 16 is formed of gallium nitride (GaN), the barrier layer 18 is formed of aluminum gallium nitride (AlGaN), and the gate G and drain D are formed of metal.

However, it is understood that this is only illustrative of various possible devices. To this extent, the substrate 14 can be formed of any of various types of compound semiconductor or dielectric materials, including for example, sapphire, diamond, germanium (Ge), gallium nitride (GaN), silicon, SiC, gallium arsenic (GaAs), and/or the like. Furthermore, the substrate 14 can comprise a conducting and/or semiconducting substrate. Similarly, layers 13, 15, 16, 18 can be formed of any combination of various types of group III nitride materials comprising one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, InGaN, AlGaInN, AlGaBN, AlInBN, and AlGaInBN with any molar fraction of group III elements. Furthermore, it is understood that the device 12A-12E can be formed from other types of semiconductor materials, including other types of group III-V materials, such as such as GaAs, GaAlAs, InGaAs, indium phosphorus (InP), and/or the like. Regardless, one or more of the layers in a heterostructure described herein can include one or more attributes to alleviate strain. For example, a layer can be formed of a superlattice structure.

Additionally, each device 12A-12F is shown including a set of space-charge control electrodes SCC1-SCC4 located on a surface of the semiconductor device 12A-12F between the gate G and the drain D. It is understood that while each device 12A-12F is shown including three or four electrodes SCC1-SCC4, a device can include any number of one or more electrodes SCC1-SCC4. When multiple electrodes SCC1-SCC4 are included, the electrodes SCC1-SCC4 can be spaced uniformly or non-uniformly within the region between the gate G and the drain D. Regardless, each electrode SCC1-SCC4 can be fabricated using any solution and can be formed of any type of material, such as a metal.

The gate G and/or one or more of the electrodes SCC1-SCC4 can form any type of contact to the surface of the semiconductor, such as a Schottky contact (shown in FIGS. 5A and 5E), a metal-oxide-semiconductor (MOS) contact, a metal-insulator-semiconductor (MIS) contact, and/or the like, to the semiconductor surface. To this extent, the devices 12B-12D, 12F of FIGS. 5B-5D and 5F are shown including insulating layers 20B-20D, 20F located between the barrier layer 18 and the gate G and the electrodes SCC1-SCC4. The insulating layers 20B-20D, 20F can reduce an amount of leakage current associated with the gate G and the electrodes SCC1-SCC4. The insulating layers 20B-20D, 20F can be formed of any type of insulating material, such as silicon dioxide ($SiO_2$), silicon nitride ($Si_3N_4$), hafnium oxide ($HfO_2$), aluminum oxide ($Al_2O_3$), and/or the like. While each insulating layer 20B-20D, 20F is shown extending across the entire region from under the gate G to the drain D, it is understood that a device can include an insulating layer that only extends under any combination of one or more of the gate G and/or the electrodes SCC1-SCC4.

Furthermore, a device can include one or more field plates. To this extent, the devices 12C, 12D are shown including a pair of field plates FP1, FP2. Field plate FP1 is connected to the gate G and extends toward the drain D, while field plate FP2 is connected to the drain D and extends toward the gate G. It is understood that the field plates FP1, FP2 are only illustrative. To this extent, a device can include any number of zero or more field plates connected to the source, the drain D, and/or the gate G. Furthermore, it is understood that one or more of the electrodes SCC1-SCC4 can be a Schottky electrode.

As illustrated, the insulating layer 20C of the device 12C can have a different thickness in the regions on which the field plates FP1, FP2 are located. Similarly, as shown in conjunction with the device 12D, the insulating layer 20 can have a varying thickness for each of the electrodes SCC1-SCC3 and/or the gate G. In this case, a voltage applied to an electrode on a thicker portion of the insulating layer 20, such as the electrode SCC3, will have less effect on the electric field at the channel than a similar voltage applied to an electrode on a thinner portion of the insulating layer 20, such as the electrode SCC1. While the insulating layer 20 is shown having an increasing thickness going in a gate G to drain D direction, it is understood that this is only illustrative and any configuration of varying thicknesses of an insulating layer for the gate and/or electrodes located thereon can be utilized. For example, a thickness of the insulating layer 20 can decrease in thickness going in a gate G to drain D direction.

A device described herein can include one or more additional features, which are configured to improve one or more aspects of operation of the device. For example, as illustrated in conjunction with the devices 12E, 12F shown in FIGS. 5E and 5F, a device can include a buffer layer 15 located between the substrate 14 and the active layer 16. Additionally, as shown in conjunction with the device 12F, a device can include an initiation layer 13 located between the substrate 14 and the buffer layer 15. The substrate 14, initiation layer 13 (when included), and/or the buffer layer 15 (when included) can be formed of a semiconducting material. For a group III nitride device 12E, 12F, illustrative materials for the substrate 14 include silicon, silicon carbide, gallium nitride, and/or the like, and illustrative materials for the initiation layer 13 and buffer layer 15 include aluminum nitride, gallium nitride, aluminum gallium nitride, a superlattice of these materials, and/or the like. However, it is understood that any materials can be selected based on the corresponding semiconductor materials used to fabricate the device.

In an embodiment, the substrate 14, the initiation layer 13, and/or the buffer layer 15 can have a conductivity type (n-type or p-type) opposite that of the conductivity type of the active channel 17. In this configuration, a peak electric field in the channel 17 and a channel surface 19 can be lowered. In a more particular illustrative embodiment, the active channel 17 is an n-type channel and the initiation layer 13, the buffer layer 15, and/or the substrate 14 are p-type. For example, a p-type doping of the buffer layer 15 can be adjusted to achieve a maximum field lowering effect, which corresponds to a full layer depletion at a maximum operating voltage of the device 12E, 12F.

In an embodiment, the buffer layer 15 includes a low-conducting layer 22 located therein. Similarly, the barrier layer 18 can include a low-conducting layer 24 located therein. While both of the buffer layer 15 and the barrier layer 18 are shown including a low-conducting layer 22, 24, respectively, in FIG. 5E, it is understood that embodiments can include low-conducting layer(s) located in only one of the buffer layer 15 or the barrier layer 18. As illustrated, the low-conducting layers 22, 24 can extend across substantially all of the active region. However, it is understood that embodiments of each of the low-conducting layers 22, 24 can extend across only a portion of the active region. Similarly, the buffer layer 15 and/or the barrier layer 18 can include any combination of multiple low-conducting layers, each of which extends across only a portion of the active region.

Figure 5C:
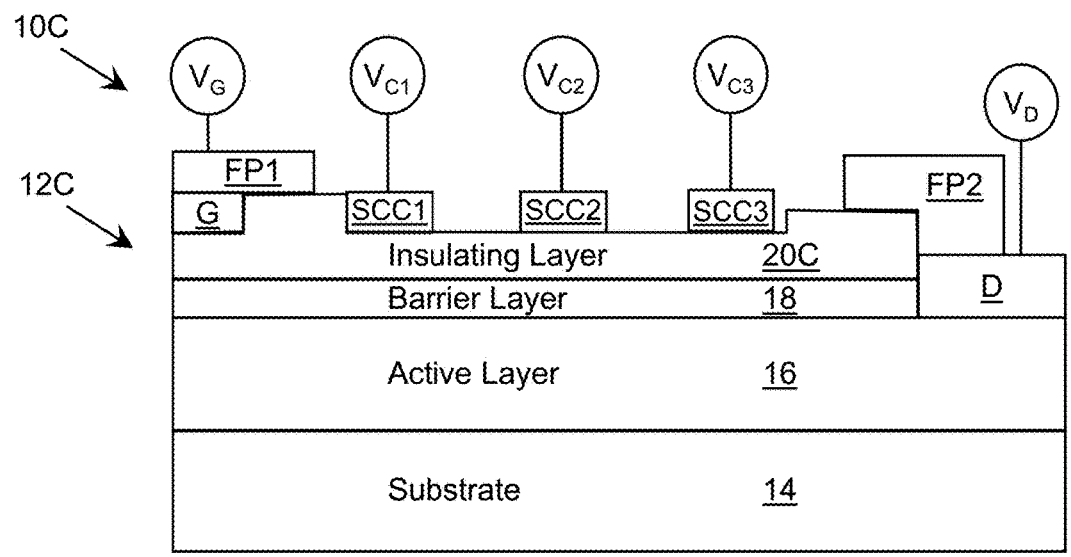
Figure 5D:
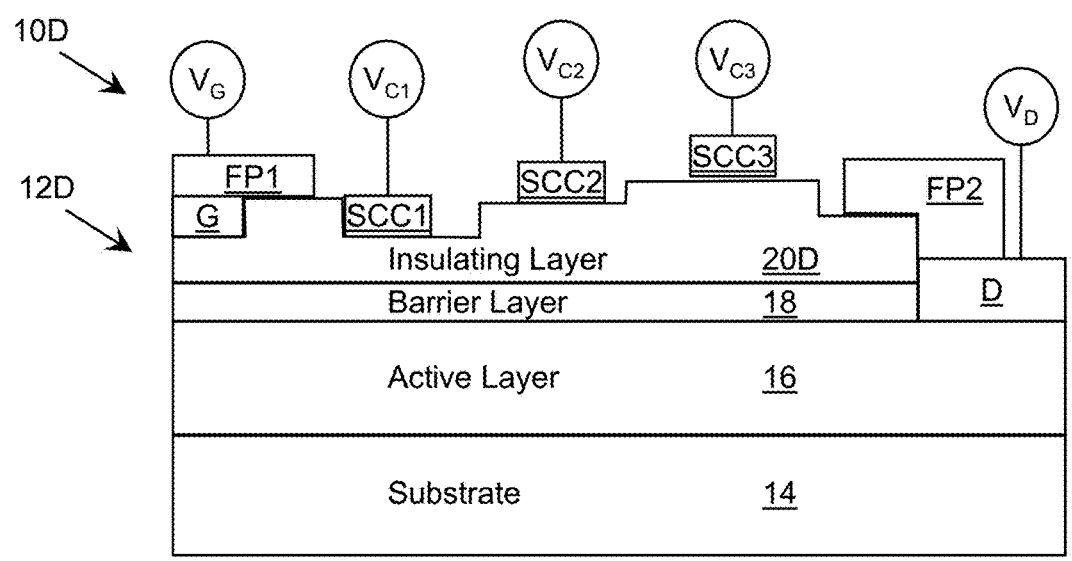
Figure 5E:
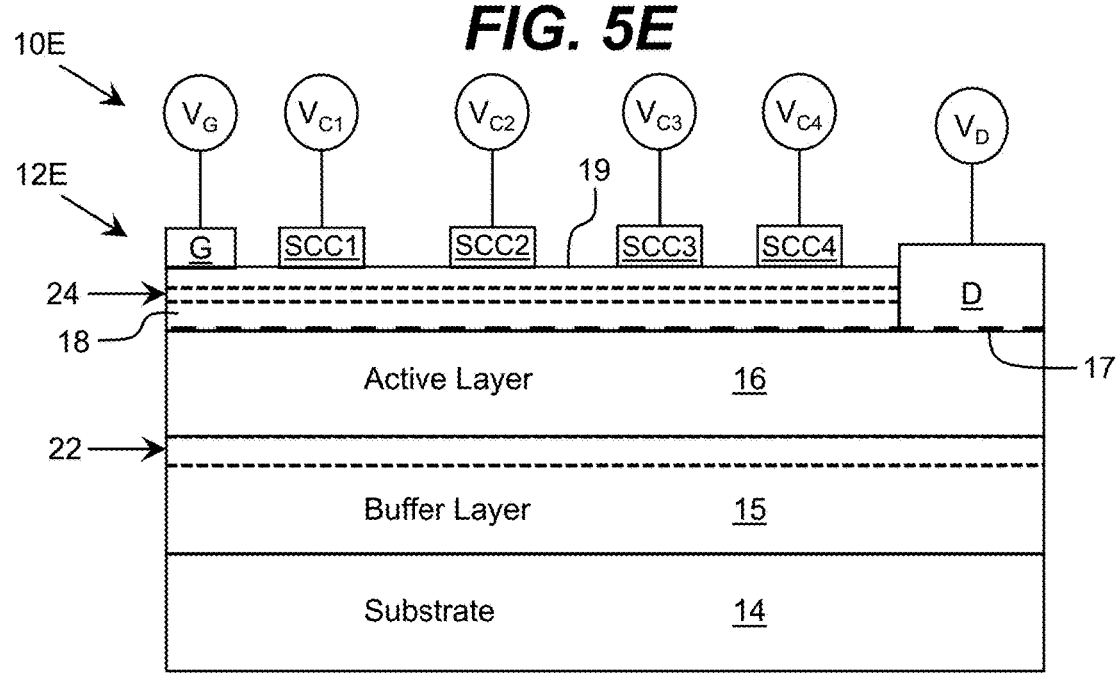
Figure 5F:
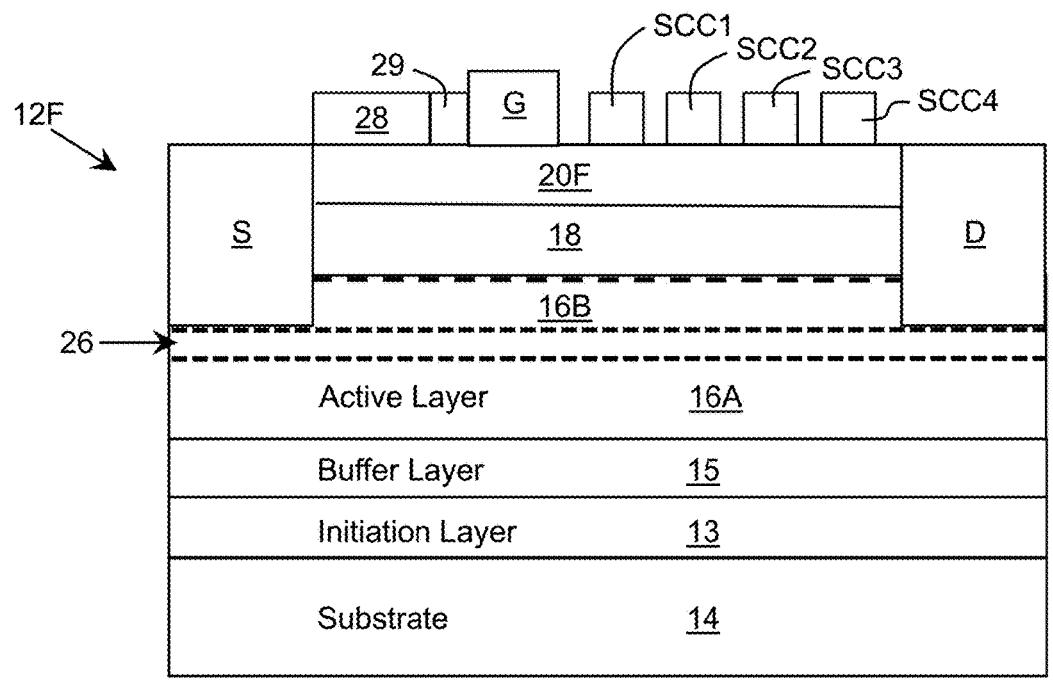

Furthermore, as shown in FIG. 5F, the active layer 16A, 16B can include a low-conducting layer 26. The buried low-conducting layer 26 is located below the active region (e.g., a device channel formed at an interface of the active layer 16B and the barrier layer 18) within the device epitaxial structure in a vicinity of the device channel. As illustrated, the buried low-conducting layer 26 can extend under all of the active region. However, it is understood that the buried low-conducting layer 26 also can only extend under a portion of the active region. Similarly, an active layer 16A, 16B can include any combination of multiple buried low-conducting layers, each of which is located under a portion of the active region. The buried low-conducting layer 26 can be electrically connected and/or capacitively coupled to one or more of the device contacts (e.g., source S, drain D, and/or the like).

Additionally, as shown in conjunction with the device 12F shown in FIG. 5F, a device described herein can include a set of surface low-conducting layers (e.g., field-controlling elements) 28. As illustrated, the surface low-conducting layer 28 can be located in the surface region between the source contact S and the gate G (gate-source region). However, it is understood that a device described herein can include one or more surface low-conducting layers 28 located in any combination of one or more of: the gate-source region; the gate-drain region; the source-drain region; and/or the like. Furthermore, a device described herein can include a low-conducting layer that forms an additional contact or passivation layer. To this extent, a low-conducting layer with low surface conductivity as described herein can be used in addition to or instead of regular metal electrodes (e.g., for the gate G, one or more of the electrodes SCC1-SCC4, and/or the like).

As illustrated in FIG. 5F, the surface low-conducting layer 28 can be located on a gate insulating layer 20F, when included. Furthermore, the gate G also can be insulated from the low-conducting layer 28. For example, the device 12F is shown including a gate insulating wall 29, which isolates the gate G from the corresponding low-conducting layer 28. The insulating wall 29 can be formed of any type of insulating material, such as silicon dioxide (SiO2), silicon nitride (Si3N4), hafnium oxide (HfO2), aluminum oxide (Al2O3), and/or the like.

A low-conducting layer 22, 24, 26, 28 can be formed of a low-conducting material using any solution. In an embodiment, a low-conducting layer 22, 24, 26, 28 is formed of a semiconductor, dielectric, metal, polycrystalline material, and/or the like, or a compound thereof. The low-conducting material can have a surface resistance that is significantly higher than that of metal electrodes, but is also much lower than that of a dielectric material. Similarly, the low-conducting material can have a surface conductivity that is significantly lower than that of metal electrodes, but is also much higher than that of a dielectric material. As a result, the associated characteristic charging-recharging time of the low-conducting layer 22, 24, 26, 28 is much higher than that of metal electrodes. To this extent, during operation of a device 12E-12F at DC or low frequencies (e.g., below 10 megahertz (MHz)), typically used for pulse or sinusoidal modulation, the low-conducting layer(s) 22, 24, 26, 28 will behave similar to metal electrodes. However, during operation of the device 12E-12F at high (signal) frequencies, (e.g., typically exceeding 100 MHz) the low-conducting layer(s) 22, 24, 26, 28 will behave similar to an insulator, thereby not deteriorating the device frequency performance.

Illustrative low-conducting materials include, for example: GaN, InGaN, or another semiconductor; a low-conducting dielectric single crystal; a textured, polycrystalline or amorphous material; a semi-metal material; oxides of nickel and other metals; composite materials, such as aluminum oxide with embedded platinum; and/or the like. The low-conducting layer 22, 24, 26, 28 can be configured to provide a discharge current path for the corresponding trapped charge. For example, the low-conducting layer(s) 22, 26 can remove trapped charges from the buffer layer 15, while the low-conducting layer(s) 24, 28 can remove surface trapped charges. In an embodiment, one or more of the discharge current paths provided by a low-conducting layer 22, 24, 26, 28 terminates at the drain contact D. Alternatively, the device 12E, 12F can include an additional contact to terminate a discharge path. For example, the device 12E can include an additional contact to terminate the discharge current path provided by the low conducting layer 22.

In an embodiment, the design and configuration of a low-conducting layer 22, 24, 26, 28 accounts for the characteristic charging-discharging time of the low-conducting layer 22, 24, 26, 28. For example, contrary to other approaches, the design and configuration of a low-conducting layer 22, 24, 26, 28 can identify a range of acceptable lateral and/or sheet resistances/conductances and/or a target lateral and/or sheet resistance/conductance for a set of low-conducting layers 22, 24, 26, 28 included in a device 12E, 12F based on a target operating frequency (e.g., a minimal operating frequency), a characteristic charge-discharge time of a trapped charge targeted for removal with the low-conducting layer 22, 24, 26, 28, a frequency targeted for suppression (e.g., interfering frequency), and/or the like. In a more particular example, a low-conducting layer 22, 24, 26, 28 is configured to have a sheet conductivity such that an associated characteristic charging-discharging time of the low-conducting layer 22, 24, 26, 28 is much (e.g., at least ten times) higher than an inverse of the minimal target operating frequency and much (e.g., at least ten times) lower than a characteristic charge-discharge time of the trapped charge targeted for removal using the low-conducting layer 22, 24, 26, 28 and/or an inverse of the maximum interfering frequency targeted for suppression. When a low-conducting layer 22, 24, 26, 28 is configured in such a manner, the low-conducting layer 22, 24, 26, 28 can normally behave as a conducting layer at direct current or low frequencies, but as an insulator within a target device operating frequency range, therefore not deteriorating the device frequency performance.

One or more aspects of a semiconductor device described herein can be designed using any solution. For example, the materials, dimensions, layer structure, and/or the like, can be selected and configured according to a target set of device operating properties using any solution. As part of designing the semiconductor device, one or more low-conducting layers 22, 24, 26, 28 can be designed as described herein. For example, a low-conducting layer 22, 24, 26, 28 can have a material with a target lateral resistance, which can be selected based on a minimum target operating frequency for the device 12E, 12F. In an embodiment, the material is selected such that a product of the target lateral resistance and a capacitance between the low-conducting layer 22, 24, 26, 28 and the device channel 17 is larger than an inverse of the minimum target operating frequency of the device 12E, 12F and the product is smaller than at least one of: a charge-discharge time of a trapped charge targeted for removal by the low-conducting layer 22, 24, 26, 28 or an inverse of a maximum interfering frequency targeted for suppression using the low-conducting layer 22, 24, 26, 28. The low-conducting layer 22, 24, 26, 28 can then be designed based on the corresponding target lateral resistance, e.g., a material for the low-conducting layer 22, 24, 26, 28 can be selected to provide a lateral resistance approximately equal to the target lateral resistance.

In an embodiment, a resistivity of the buried low-conducting layer 22, 24, 26 can be designed such that a characteristic time constant of the buried low-conducting layer 22, 24, 26 is lower than that of a trapped charge, but much higher than a period of a signal corresponding to a lowest target operating frequency for the device 12E, 12F. In this manner, the buried low-conducting layer 22, 24, 26 can have a minimal effect on the operating frequency of the device, while being capable of removing the corresponding trapped charge. In another embodiment, the material forming the low conducting layer 22, 24, 26 has a sheet resistance between approximately $1 \times 10^3$ (approximately $1 \times 10^5$ in a still more particular embodiment) Ohms per square and approximately $1 \times 10^7$ Ohms per square. Each low-conducting layer 22, 24, 26 can be located any distance from the active channel 17. In an embodiment, one or more of the low-conducting layers 22, 24, 26 are located within a channel space-charge region (generally within a distance of ten nanometers to one micrometer from the device active region). In an embodiment, a low-conducting layer 22, 24, 26 can be located outside of a vicinity of the active channel 17, e.g., outside of a channel space-charge region (e.g., generally greater than ten nanometers to one micrometer from the active channel 17).

A device described herein can include one or more additional features, which enable further control of the electrical field distribution during operation of the corresponding device. For example, such control can enable the electrical field to be further spread more evenly throughout the device, thereby increasing a breakdown voltage for the device. Furthermore, such control can enable the off-voltage for a device to be lowered, thereby making operation of the corresponding circuit more efficient.

Figure 6A:
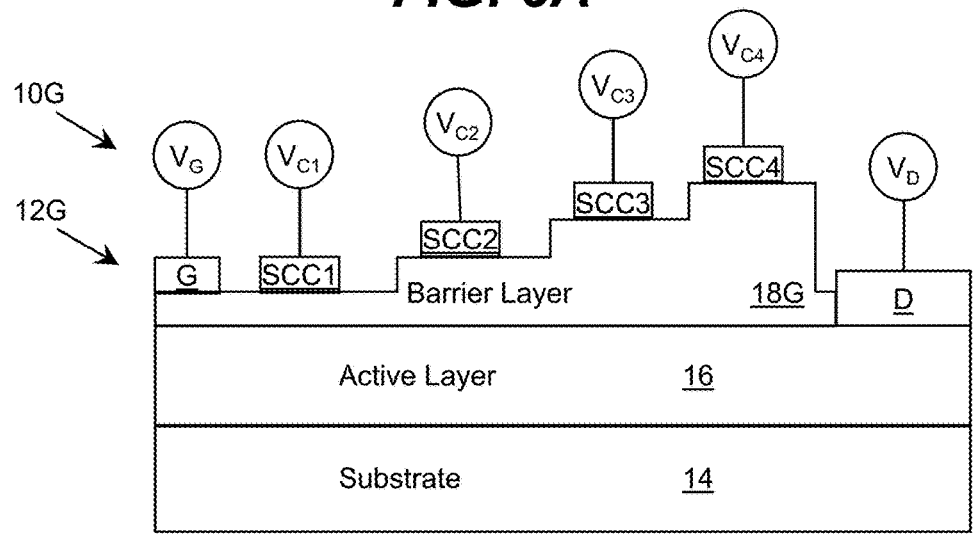
FIGS. 6A and 6B show schematic structures of illustrative devices according to other embodiments.

To this extent, as described herein, a device, such as the device 12D shown in FIG. 5D, can have an insulating layer 20D with a varying thickness. In an embodiment, an embodiment of a device can include a barrier layer of varying thickness. To this extent, FIG. 6A shows a schematic structure of an illustrative device 12G connected in a circuit 10G according to an embodiment. In this case, the device 12G includes a barrier 18G having a different thickness for each of the electrodes SCC1-SCC4 located thereon. As illustrated, a thickness of the barrier 18G can increase in a direction between the gate G and the drain D, before being reduced immediately adjacent to the drain D. However, it is understood that this is only illustrative, and any configuration of varying thicknesses of a barrier layer for the gate G and/or electrodes SCC1-SCC4 located thereon can be utilized. For example, a thickness of the barrier layer 18G can decrease in thickness going in a gate G to drain D direction. Furthermore, it is understood that while each electrode SCC1-SCC4 shown in FIGS. 5D and 6A is located on a region of the corresponding insulating or barrier layer having a unique thickness, it is understood that two or more electrodes can be located on region(s) having the same or substantially the same thickness.

Figure 6B:
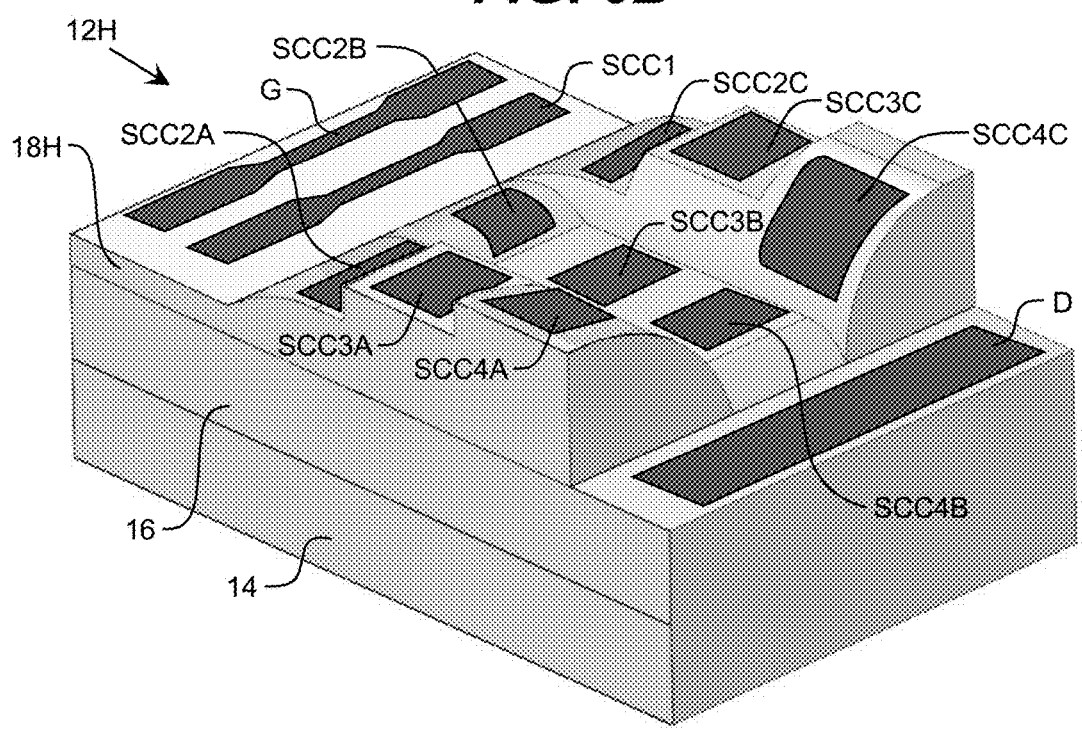

It is understood that a device described herein also can include one or more features that vary laterally (e.g., transverse to current flow), which can be configured to facilitate further control of the electrical field distribution. For example, FIG. 6B shows a schematic structure of an illustrative device 12H according to an embodiment. Similar to the device 12G shown in FIG. 6A, the device 12H includes a barrier layer 18H having a varying thickness in the direction between the gate G and the drain D. However, a thickness of the barrier layer 18H also varies laterally. Furthermore, a height of one or more of the space-charge control electrodes also can vary. To this extent, as illustrated, the device 12H is shown including a first space-charge control electrode SCC1 located adjacent to the gate. However, the device 12H includes multiple electrode groups arranged within the spacing between the electrode SCC1 and the drain D. To this extent, a first electrode group includes electrodes SCC2A-SCC2C; a second electrode group includes electrodes SCC3A-SCC3C; and a third electrode group includes electrodes SCC4A-SCC4C. While the device 12H is shown including three electrode groups, each with three electrodes, it is understood that this is only illustrative and a device described herein can include any number of electrode groups, each of which can include any number of electrodes.

As illustrated, the various electrodes can have any of various configurations. For example, a gate, drain, or space-charge control electrode can have a width that varies in a direction transverse to the current flow. To this extent, the gate G and the electrode SCC1 are each shown having a width varying width. In an embodiment, the width of the electrode, such as the gate G or the electrode SCC1, is wider near an edge of the device 12H and narrower in the middle. However, it is understood that this is only illustrative. Similarly, it is understood that the electrodes of a group can have widths that vary in a direction transverse to the current flow. For example, the electrode SCC3B can have a width smaller than that of the electrodes SCC3A, SCC3C. Additionally, an electrode can have a varying height. For example, the electrode SCC2B is shown having a height that varies in a direction between the gate G and the drain D, while the electrode SCC4C is shown having a height that varies in a direction transverse to the direction between the gate G and the drain D.

While not shown for clarity, the device 12H can be connected to a circuit described herein. In an embodiment, each group of electrodes is connected to a same bias voltage. To this extent, using the circuit 10G shown in FIG. 6A as an illustrative circuit, electrode SCC1 can be connected to the bias voltage $V_{C1}$; electrodes SCC2A-SCC2C can be connected to the bias voltage $V_{C2}$; electrodes SCC3A-SCC3C can be connected to the bias voltage $V_{C3}$; and electrodes SCC4A-SCC4C can be connected to the bias voltage $V_{C4}$. However, it is understood that these groups are only illustrative, and a circuit can be configured to group any combination of electrodes to a single bias voltage and/or apply a unique bias voltage to each of the electrodes. To this extent, two or more space-charge control electrodes located different distances from the gate G could be grouped based on, for example, the corresponding differing thicknesses of the barrier layer 18H for the electrodes and/or the differing widths of the electrodes, either or both of which can alter an effect of the bias voltage on the electrical field for the device 12H. Regardless, the bias voltage applied to a particular space-charge control electrode can be selected to control one or more aspects of the electrical field distribution (e.g., to spread the distribution).

When a device 12A-12H is implemented in a circuit 10A-10G, the circuit 10A-10G can include components that apply an individual voltage bias $V_{C1}$-$V_{C4}$ to each of the electrodes SCC1-SCC4, respectively. In this case, individually biased electrodes SCC1-SCC4 can provide independent control of a potential difference between a corresponding portion of the channel located under the electrode SCC1-SCC4 and the drain D. In an embodiment, the voltage $V_{C1}$-$V_{C4}$ applied to each electrode SCC1-SCC4 is sufficiently high to deplete the portion of the channel located below the corresponding electrode SCC1-SCC4. Furthermore, the voltage $V_{C1}$-$V_{C4}$ applied to each electrode SCC1-SCC4 is significantly below (e.g., by at least 30%) a breakdown voltage between the electrode SCC1-SCC4, the gate G, the drain D, and the other electrodes SCC1-SCC4. In this case, the electrodes SCC1-SCC4 can reduce premature breakdown, which can occur between the field plate(s) and the drain electrode of prior art devices, since the voltages between the electrodes SCC1-SCC4 and the other electrodes are much lower than the breakdown voltage.

During operation of the device 12A-12H within the circuit 10A-10G, the voltages $V_{C1}$-$V_{C4}$ applied to each electrode SCC1-SCC4 can be configured to provide any target space-charge (electric field) profile in the spacing between the gate G and the drain D. Furthermore, the electrodes SCC1-SCC4 can be used to achieve any target (e.g., required) degree of depletion and/or space-charge region extension within the spacing between the gate G and the drain D. In an embodiment, the space-charge profile is configured to provide an increased (e.g., maximal) breakdown voltage for the device 12A-12H over other approaches.

Figure 7:
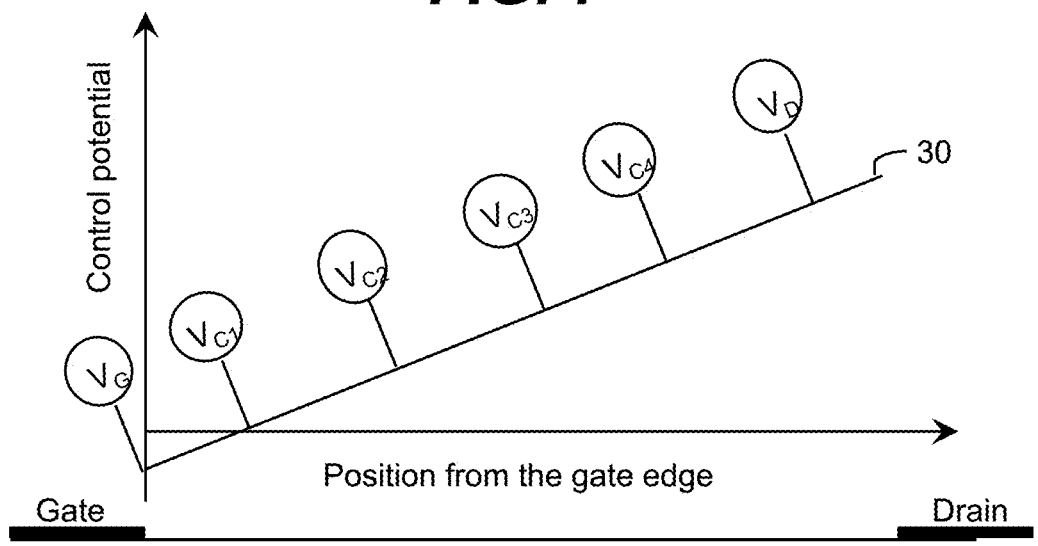
FIG. 7 shows an illustrative schematic voltage biasing diagram according to an embodiment.

The voltage $V_{C1}$-$V_{C4}$ applied to each electrode SCC1-SCC4 can be selected based on a location of the electrode SCC1-SCC4 relative to the gate G and the drain D, the gate voltage bias $V_G$, and/or the drain voltage $V_D$. For example, FIG. 7 shows an illustrative schematic voltage biasing diagram according to an embodiment. In this case, a linear function 30 can be calculated using a linear interpolation between two points in a plot of a distance between adjacent edges of the gate G and the drain D versus a difference between the gate voltage bias $V_G$ and the drain voltage $V_D$. Each voltage $V_{C1}$-$V_{C4}$ can be calculated using the linear function and a location of the corresponding electrode SCC1-SCC4 (e.g., a gate-side edge of the electrode) from a drain-side edge of the gate G. Alternatively, it is understood that a target location of an electrode SCC1-SCC4 can be calculated using the linear function and a corresponding voltage $V_{C1}$-$V_{C4}$ to be applied to the electrode SCC1-SCC4. Furthermore, it is understood that each voltage $V_{C1}$-$V_{C4}$ also can be calculated based on one or more additional factors.

For example, when a device includes an insulating layer having a varying thickness, such as the insulating layer 20D (FIG. 5D), the corresponding voltage $V_{C1}$-$V_{C4}$ to be applied to each electrode SCC1-SCC3 (FIG. 5D) can be further based on the corresponding thickness of the insulating layer 20D. To this extent, the varying thickness of an insulating layer can be used to adjust (e.g., reduce) a difference in the voltages applied to the corresponding electrodes from that which would be otherwise required to have a desired effect on the electric field, such as those voltages calculated using the linear function 30.

Figure 8:
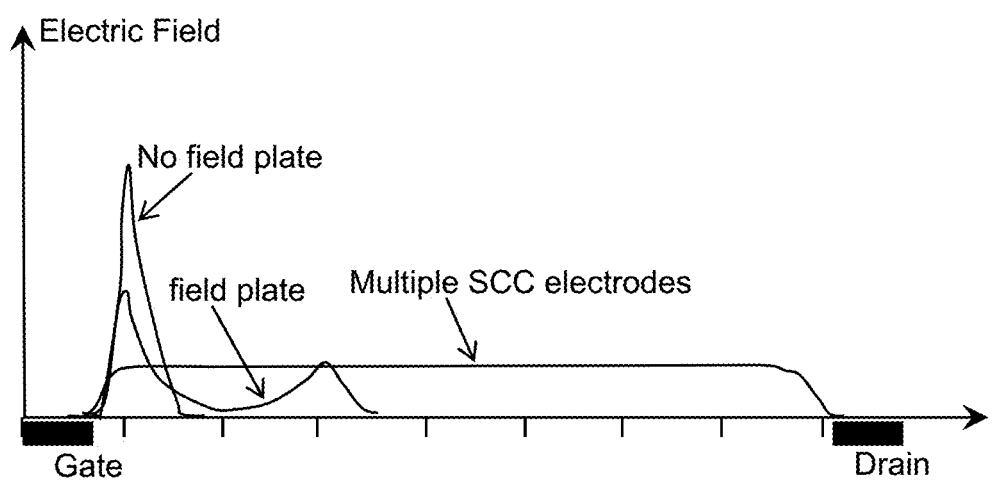
FIG. 8 shows an illustrative comparison of qualitative electric field profiles according to an embodiment.

As described herein, the electrodes SCC1-SCC4 can be operated to provide improved control over the electric field within the spacing between the gate G and the drain D of a device 12A-12H. To this extent, FIG. 8 shows an illustrative comparison of qualitative electric field profiles according to an embodiment. As illustrated for a FET, such as FET 2A (FIG. 1), the electric field exhibits a strong peak near the gate edge. Using a field plate, the electric field peak near the gate can be reduced by splitting the electric field into two or more peaks. However, using the electrodes SCC1-SCC4 and corresponding circuit described herein, the electric field distribution can be substantially uniform between the gate G and the drain D.

It is understood that the various device configurations shown herein are only illustrative of numerous device configurations possible. To this extent, a device can include more or fewer layers having any of various configurations. For example, a device can include an isolation layer and/or a passivation layer over some or all of the surface of the structure. Additionally, it is understood that the space-charge control electrodes SCC1-SCC4 described herein can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like.

Furthermore, the space-charge control electrodes can be implemented in other types of semiconductor devices, including for example, a diode of any type, a semiconductor resistor, a semiconductor sensor, a light emitting diode, a laser, an integrated element, and/or the like. To this extent, FIG. 9 shows a schematic structure of an illustrative diode 12I connected in a circuit 10I according to an embodiment. As illustrated, the diode 12I includes three electrodes SCC1-SCC3 located in the spacing between the cathode and the anode. During operation of the diode 12I in the circuit 10I, the circuit 10I can include components to bias the electrodes SCC1-SCC3 as described herein.

An embodiment of a space-charge control electrode described herein can have a non-rectangular shape. For example, a space-charge control electrode can include a set of openings located along a lateral width of the electrode. To this extent, FIGS. 12A and 12B show top and side views, respectively, of an illustrative space-charge control electrode SCC located on a barrier layer 18 according to an embodiment. While the space-charge control electrode SCC is shown located on the barrier layer 18, it is understood that the space-charge control electrode SCC can be formed on any layer, which may be located between the space-charge control electrode SCC and the barrier layer 18.

Regardless, as illustrated, the space-charge control electrode SCC includes a plurality of stripes of conducting material (e.g., metal) MS1-MS4 aligned in a substantially parallel fashion along a direction of current flow through the device channel, which are physically separated from one another by openings. While four stripes of conducting material MS1-MS4 are shown in FIGS. 12A and 12B, it is understood that embodiments of the space-charge control electrode SCC can include any number of two or more stripes of conducting material. Furthermore, the stripes of conducting material MS1-MS4 are shown physically connected by a stripe of conducting material (e.g., metal) CM substantially perpendicular to the other stripes of conducting material MS1-MS4. However, it is understood that this is only illustrative of various configurations that can be utilized to electrically connect the stripes of conducting material MS1-MS4 of the space-charge control electrode SCC.

The stripes of conducting material MS1-MS4 (and corresponding openings) of the space-charge control electrode SCC can have any of various dimensions. For example, an embodiment of the space-charge control electrode SCC has multiple stripes of conducting material MS1-MS4 covering a total channel width CW (indicated in FIG. 12A). In an illustrative embodiment, within the total channel width CW, a ratio of the channel width covered by the stripes of conducting material MS1-MS4 to the channel width not covered by the stripes of conducting material MS1-MS4 is in a range of 1:1 to 10:1. A target ratio can be selected using any solution. For example, the target ratio can be selected based on an intended application (e.g., operating frequency, operating voltage, and/or the like) for the corresponding device/circuit. In particular, a space-charge control electrode SCC having a larger width CW can provide better control of the electric field over the entire device width. However, an increased width CW can result in an increased capacitance. Similarly, the stripes of conducting material MS1-MS4 can have the widths and/or spacing selected to provide a target amount of control of the electric field while having a capacitance below an acceptable level for the corresponding application.

Figure 10A:
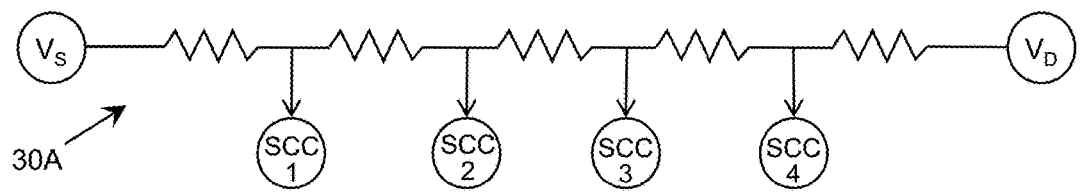
FIGS. 10A-10D show illustrative biasing networks according to embodiments.

As discussed herein, a circuit can include components that individually bias each of the space-charge control electrodes. To this extent, FIGS. 10A-10D show illustrative biasing networks 30A-30D according to embodiments. In FIG. 10A, the biases are provided using a resistive divider type of biasing network 30A with the divider connected between the source, $V_S$, and drain, $V_D$, electrodes. In this case, a resistive component is located between each of the source voltage $V_S$, the voltage sources for each of the electrodes SCC1-SCC4, and the drain voltage $V_D$, thereby providing a unique voltage to each of the electrodes SCC1-SCC4.

The resistance values can be selected to ensure the source-drain leakage current does not exceed a maximum allowed value. For example, for a maximum off-state current, $I_{OFFMAX}$, and a maximum drain bias, $V_{DMAX}$, a total resistance of the biasing network 30A, $R_{DIV}$, should meet the condition $R_{DIV} > V_{DMAX}/I_{OFFMAX}$. An individual resistance value for each of the resistive components in the biasing network 30A can be selected based on the corresponding locations of the electrodes, e.g., using the linear function shown in FIG. 7.

Figure 10B:
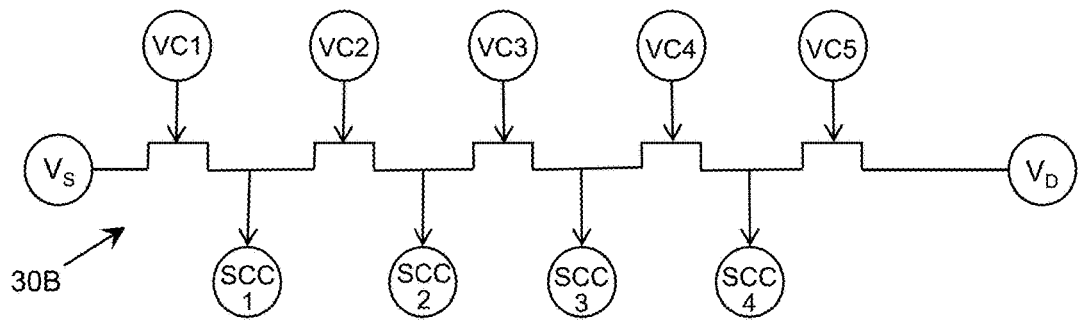
Figure 10C:
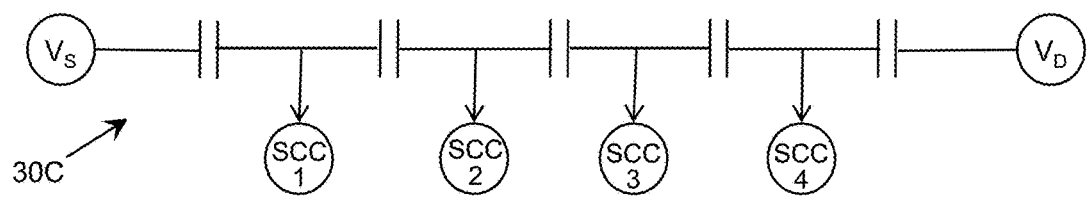
Figure 10D:
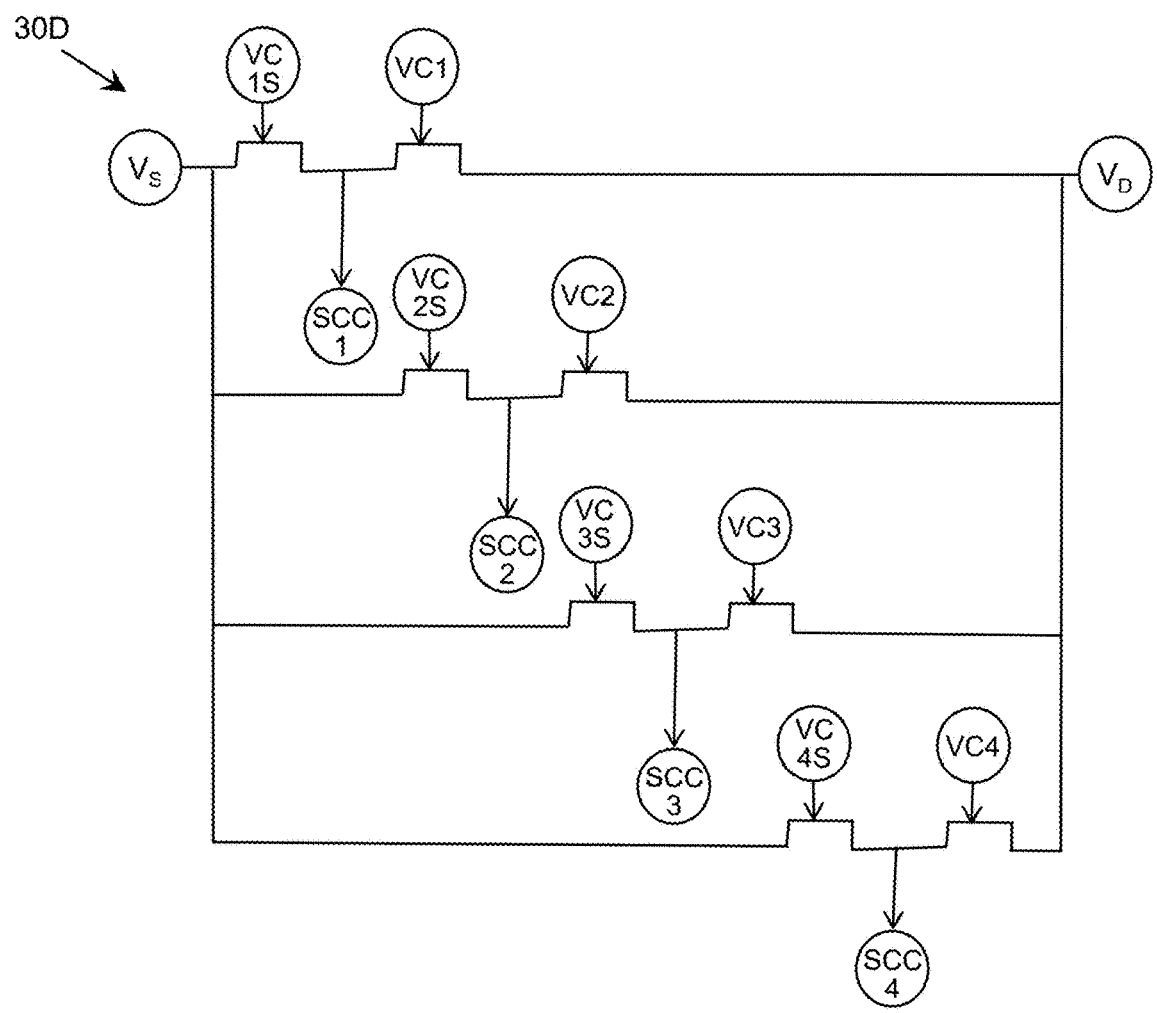

Alternatively, the biasing network can be formed using nonlinear elements, such as transistors of any type, diodes, or the like. For example, FIG. 10B shows a biasing network 30B formed by an active voltage controlled voltage divider using a series of transistors, e.g., field effect transistors or bipolar junction transistors. In this case, each of the transistors can be controlled using a unique voltage control, VC1-VC5, thereby providing individual control over the biases provided to the space-charge control electrodes. In FIG. 10C, the biasing network 30C is formed using a capacitive divider. In this configuration, an amount of additional leakage current associated with the biasing network 30C can be reduced. In FIG. 10D, the biasing network 30D is formed by a parallel connection of biasing elements or any other type of circuitry delivering individual and independent biases to the space-charge control electrodes. In this case, the voltage bias for each space-charge control electrode (SCC1-SCC4) is provided using a pair of individually controlled transistors.

It is understood that the biasing networks 30A-30D are only illustrative of various analog or digital electronic circuits that can be utilized to provide the target biasing to each space-charge control electrode. In an embodiment, a circuit is configured to generate a variable, predetermined current pulse using a device described herein. For example, the circuit can be configured to apply specified waveforms of voltages to one or more of the space-charge control electrodes of the device. The waveforms of voltages can result in the current pulse being generated by the device.

It is understood that the various semiconductor devices described herein can be manufactured using any solution. For example, a device heterostructure can be formed using any solution, e.g., by obtaining (e.g., forming, preparing, acquiring, and/or the like) a substrate 14, forming (e.g., growing, depositing, adhering, and/or the like) an initiation layer and/or a buffer layer thereon, forming an active layer 16 thereon, and forming a barrier layer 18 on the active layer 16. Additionally, metal electrode(s), dielectric layer(s), and/or the like, can be formed on the device heterostructure using any solution. Furthermore, as described herein, the manufacture of the device can include the formation of one or more space-charge control electrodes and/or one or more low-conducting layers using any solution. It is understood that the manufacture of a device described herein can include additional processing, including for example: the deposition and removal of a temporary layer, such as mask layer; the patterning one or more layers; the formation of one or more additional layers/contacts not shown; application to a submount (e.g., via contact pads); and/or the like.

Similarly, it is understood that the various circuits described herein can be manufactured using any solution. For example, one or more of the space-charge control electrodes of a device can include connectors for applying an external bias or other signal to the corresponding space-charge control electrode(s). Furthermore, the biasing network can comprise a built-in biasing network. The circuit also can be formed of a series of discrete components, a monolithic integrated circuit, or a hybrid circuit. Additionally, while each space-charge control electrode is shown and described as being individually controlled, it is understood that the circuit can provide a required bias to a group of two or more space-charge control electrodes that are connected to each other.

While shown and described herein as a method of designing and/or fabricating a semiconductor device and/or circuit, it is understood that aspects of the invention further provide various alternative embodiments. For example, in one embodiment, the invention provides a method of designing and/or fabricating a circuit that includes one or more of the semiconductor devices designed and fabricated as described herein.

Figure 11:
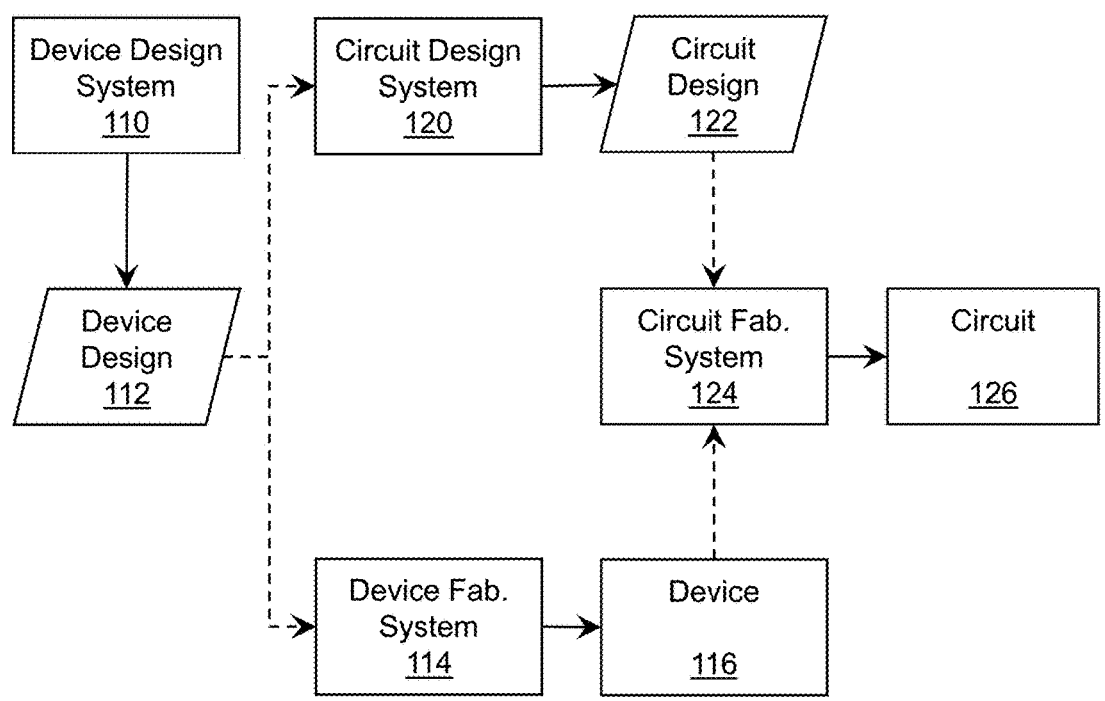
FIG. 11 shows an illustrative flow diagram for fabricating a circuit according to an embodiment.

To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A circuit comprising:
   a semiconductor device including:
   a semiconductor structure including: a barrier layer; an active layer; and a channel formed at a junction of the active layer and the barrier layer;
   a first terminal and a second terminal, wherein the first terminal, the second terminal, and the barrier layer are located on a first side of the active layer; and
   a plurality of sets of space-charge control electrodes spaced entirely between the first terminal and the second terminal on the barrier layer, wherein an individual bias voltage is supplied to each of the plurality of sets of space-charge control electrodes, wherein the bias voltage for each of the plurality of sets of space-charge control electrodes is selected based on a bias voltage of the first terminal, a bias voltage of the second terminal, and a location of the set of space-charge control electrodes relative to the first terminal and the second terminal, and wherein the semiconductor device further includes an insulating layer located between at least one of the plurality of sets of space-charge control electrodes and the barrier layer.

2. The circuit of claim 1, wherein the bias voltage for each of the plurality of sets of space-charge control electrodes is calculated using a linear function derived from the bias voltage of the first terminal, the bias voltage of the second terminal, and the distance between the first terminal and the second terminal.

3. The circuit of claim 1, wherein the semiconductor structure further includes a buffer layer located on a second side of the active layer opposite the first side, wherein a conductivity type of the buffer layer is opposite a conductivity type of the channel.

4. The circuit of claim 1, wherein the semiconductor structure further includes a buffer layer located on a second side of the active layer opposite the first side, wherein the buffer layer includes a low-conducting layer having a sheet resistance between approximately $1\times10^3$ Ohms per square and approximately $1\times10^7$ Ohms per square.

5. The circuit of claim 1, wherein at least one of: the active layer or the barrier layer includes a low-conducting layer having a sheet resistance between approximately $1\times10^3$ Ohms per square and approximately $1\times10^7$ Ohms per square.

6. The circuit of claim 1, wherein the insulating layer has a different thickness for each of the plurality of sets of space-charge control electrodes.

7. The circuit of claim 1, wherein the semiconductor device further includes at least one field plate connected to one of: the first terminal or the second terminal, and wherein the plurality of sets of space-charge control electrodes are spaced entirely between the at least one field plate and the other of: the first terminal or the second terminal.

8. The circuit of claim 1, wherein the semiconductor structure further includes a substrate located on a second side of the active layer opposite the first side, wherein the substrate is one of: a conducting substrate or a semiconducting substrate, and wherein a conductivity type of the substrate is opposite a conductivity type of the channel.

9. The circuit of claim 1, wherein at least one of the plurality of sets of space-charge control electrodes includes a set of openings located along a lateral width of the at least one of the plurality of sets of space-charge control electrodes.

10. A circuit comprising:
    a semiconductor device including:
    a semiconductor structure including: a barrier layer; an active layer; and a channel formed at a junction of the active layer and the barrier layer;
    a first terminal and a second terminal, wherein the first terminal, the second terminal, and the barrier layer are located on a first side of the active layer; and
    a plurality of sets of space-charge control electrodes spaced entirely between the first terminal and the second terminal on the barrier layer, wherein an individual bias voltage is applied to each of the plurality of sets of space-charge control electrodes, wherein the bias voltage for each of the plurality of sets of space-charge control electrodes is configured to deplete a region of the channel under the corresponding set of space-charge control electrodes at an operating voltage applied to the second terminal, wherein the semiconductor device further includes at least one field plate connected to one of: the first terminal or the second terminal, and wherein the plurality of sets of space-charge control electrodes are spaced entirely between the at least one field plate and the other of: the first terminal or the second terminal.

11. The circuit of claim 10, wherein the bias voltage for each of the plurality of sets of space-charge control electrodes is calculated using a linear function derived from the bias voltage of the first terminal, the bias voltage of the second terminal, and the distance between the first terminal and the second terminal.

12. The circuit of claim 10, wherein the semiconductor structure further includes a buffer layer located on a second side of the active layer opposite the first side, wherein a conductivity type of the buffer layer is opposite a conductivity type of the channel.

13. The circuit of claim 10, wherein the semiconductor structure further includes a buffer layer located on a second side of the active layer opposite the first side, wherein the buffer layer includes a low-conducting layer having a sheet resistance between approximately $1\times10^3$ Ohms per square and approximately $1\times10^7$ Ohms per square.

14. The circuit of claim 10, wherein the semiconductor device further includes an insulating layer located between at least one of the plurality of sets of space-charge control electrodes and the barrier layer.

15. The circuit of claim 14, wherein the insulating layer has a different thickness for each of the plurality of sets of space-charge control electrodes.

16. The circuit of claim 10, wherein at least one of: the active layer or the barrier layer includes a low-conducting layer having a sheet resistance between approximately $1\times10^3$ Ohms per square and approximately $1\times10^7$ Ohms per square.

17. The circuit of claim 10, wherein at least one of the plurality of sets of space-charge control electrodes includes a set of openings located along a lateral width of the electrode.

18. A circuit comprising:
a group III nitride-based transistor including:
a semiconductor structure including: a barrier layer; an active layer; and a channel formed at a junction of the active layer and the barrier layer;
a gate and a drain, wherein the gate, the drain, and the barrier layer are located on a first side of the active layer; and
a plurality of sets of space-charge control electrodes spaced entirely between the gate and the drain, wherein an individual bias voltage is applied to each of the plurality of sets of space-charge control electrodes, wherein the bias voltage for each of the plurality of sets of space-charge control electrodes is selected based on a bias voltage of the gate, a bias voltage of the drain, and a location of the set of space-charge control electrodes relative to the gate and the drain.

19. The circuit of claim 18, wherein at least one of the sets of space-charge control electrodes includes a plurality of space-charge control electrodes.

20. The circuit of claim 18, further comprising a biasing network supplying the individual bias voltage for each of the plurality of sets of space-charge control electrodes, wherein the bias voltage for each of the plurality of sets of space-charge control electrodes is configured to deplete a region of the channel under the corresponding set of space-charge control electrodes at an operating voltage applied to the drain.

* * * * *